(12) United States Patent
Koji

(10) Patent No.: US 7,746,126 B2
(45) Date of Patent: Jun. 29, 2010

(54) LOAD DRIVING CIRCUIT

(75) Inventor: Takeda Koji, Oita (JP)

(73) Assignee: Hiji High-Tech Co., Ltd., Oita (JP)

( * ) Notice: Subject to any disclaimer, the term of this patent is extended or adjusted under 35 U.S.C. 154(b) by 0 days.

(21) Appl. No.: 11/886,999

(22) PCT Filed: Mar. 7, 2006

(86) PCT No.: PCT/JP2006/304393

§ 371 (c)(1),
(2), (4) Date: Oct. 28, 2008

(87) PCT Pub. No.: WO2006/103889

PCT Pub. Date: Oct. 5, 2006

(65) Prior Publication Data

US 2009/0212828 A1    Aug. 27, 2009

(30) Foreign Application Priority Data

Mar. 29, 2005  (JP) ............................ 2005-095362

(51) Int. Cl.
*H03K 3/00* (2006.01)
(52) U.S. Cl. ...................................... 327/112; 327/108
(58) Field of Classification Search ......... 327/108–112; 326/82–84
See application file for complete search history.

(56) References Cited

U.S. PATENT DOCUMENTS 7,271,630 B2 *  9/2007  Su ............................. 327/112
7,348,848 B2 *  3/2008  Huang ....................... 330/253
7,495,483 B2 *  2/2009  Kumar et al. ............... 327/112
7,521,971 B2 *  4/2009  Yamazaki ................... 327/112

FOREIGN PATENT DOCUMENTS

| JP | 49-060157 | 6/1974 |
| JP | U56-19912 | 2/1981 |
| JP | 01-130621 | 5/1989 |
| JP | 06-216662 | 8/1994 |
| JP | 07-106871 | 4/1995 |
| JP | 08-288825 | 11/1996 |
| JP | 11-249625 | 9/1999 |
| JP | 2001-285050 | 10/2001 |

OTHER PUBLICATIONS

International Search Report for PCT/JP2006/304393, dated Apr. 11, 2006.

* cited by examiner

*Primary Examiner*—Hai L Nguyen
(74) *Attorney, Agent, or Firm*—Edwards Angell Palmer & Dodge LLP

(57) ABSTRACT

To provide a load drive circuit that has a satisfactory phase characteristic and can be realized as a low-price LSI chip. A series circuit of nonlinear resistive elements (P2 and N3) and switch elements (N2 and P3) is inserted between control input terminals (GP1 and GN1) of output elements (P1 and N1) of a final amplifier (AMP0) and an output terminal (OUT) of the load drive circuit. The nonlinear resistive element has a nonlinear characteristic in which a resistance value decreases as an applied voltage value increases and the resistance value increases as the applied voltage value decreases. The switch elements are switching-controlled to selectively come into an ON state only in a high-electric potential period or a low-electric potential period of an input signal according to whether the output element is arranged on a high-electric potential side or a low-electric potential side in the final amplifier.

13 Claims, 13 Drawing Sheets

LOAD DRIVING CIRCUIT

TECHNICAL FIELD

The present invention relates to, for example, a load drive circuit built in a source driver of a liquid crystal display panel and used, for example, when a signal line of the liquid crystal display panel is driven in response to a multi-valued output of an n-bit D/A converter.

BACKGROUND ART

In a load drive circuit built in a source driver of a liquid crystal display panel and used, for example, when a signal line of the liquid crystal display panel is driven, a phase compensator is built in with an intention of improvement of a phase characteristic, prevention of oscillation of the circuit, and the like (see, for example, Patent Documents 1, 2, and 3).

An example of such a load drive circuit in which the phase compensator is built is shown in FIG. 12. As shown in the figure, this load drive circuit includes an output terminal OUT to which a load (not shown) should be connected, an input terminal IN to which an input signal should be given, a final amplifier AMP0 including output elements (P1 and N1) for driving the load, preamplifiers (AMP1 and AMP2) for driving output elements (P1, N1) included in the final amplifier according to an input signal, and phase compensators (a rising edge phase compensator 13 and a falling edge phase compensator 14) for improving a phase characteristic between input and output signal waveforms and is constituted such that an output signal of a non-inverting form appears at the output terminal according to the input signal given to the input terminal IN.

In this example, the final amplifier AMP0 is constituted by a complementarily-connected pair of output elements (a MOS field effect transistor P1 of a p-channel type (hereinafter simply referred to as "transistor P1") and a MOS field effect transistor N1 of an n-channel type (hereinafter simply referred to as "transistor N1") The output elements (the transistors P1 and N1) are biased such that the final amplifier AMP0 performs, for example, a class AB operation.

The preamplifier is constituted by a first inverting amplifier AMP1 that amplifies an electric potential difference between the input terminal IN and the output terminal OUT and gives the electric potential difference to a control input terminal (a gate terminal GP1) of a high-potential side output element (the transistor P1) of the final amplifier AMP0 and a second inverting amplifier AMP2 that amplifies an electric potential difference between the input terminal IN and the output terminal OUT and gives the electric potential difference to a control input terminal (a gate terminal GN1) of a low-potential side output terminal (the transistor N1) of the final amplifier AMP0.

The rising edge phase compensator 13 includes a series circuit of a resistive element R1 and a capacitor C1 inserted between the control input terminal (GP1) of the high-potential side output element (the transistor P1) and the output terminal OUT. The falling edge phase compensator 14 includes a series circuit of a resistive element R2 and a capacitor C2 inserted between the control input terminal (GN1) of the low-potential side output terminal (the transistor N1) and the output terminal OUT.

A waveform chart showing signal waveforms of respective sections of the load drive circuit is shown in FIG. 13. As shown in the figure, when an electric potential of the input terminal IN changes from a low electric potential to a high electric potential, the first inverting amplifier AMP1 reduces the electric potential of the gate terminal GP1 of the transistor P1 and, at the same time, the second inverting amplifier AMP2 reduces the electric potential of the gate terminal GN1 of the transistor N1 such that the electric potential of the output terminal OUT and the electric potential of the input terminal IN become the same electric potential.

Then, a driving ability of the transistor P1 increases because an electric potential difference between a gate and a source increases. On the other hand, a driving ability of the transistor N1 decreases because the electric potential difference between the gate and the source decreases.

At this point, the capacitor C1 included in the phase compensator 13 is instantaneously discharged through capacity division by a load capacitor connected to the output terminal OUT. Thus, the electric potential of the gate terminal GP1 of the transistor P1 is reduced only in a certain period immediately after the rising edge of the input terminal IN and an initial driving ability of the transistor P1 is further intensified. Consequently, the electric potential of the output terminal OUT can instantaneously rise following the electric potential of the input terminal IN and a phase characteristic is improved.

On the other hand, when the electric potential of the input terminal IN changes from a high electric potential to a low electric potential, the first inverting amplifier AMP1 increases the electric potential of the gate terminal GP1 of the transistor P1 and, at the same time, the second inverting amplifier AMP2 increases the electric potential of the gate terminal GN1 of the transistor N1 such that the electric potential of the output terminal OUT and the electric potential of the input terminal IN become the same electric potential.

Then, a driving ability of the transistor P1 decreases because an electric potential difference between the gate and the source decreases. On the other hand, a driving ability of the transistor N1 increases because the electric potential difference between the gate and the source increased.

At this point, the capacitor C2 included in the phase compensator 14 is instantaneously charged through capacity division by a load capacitor connected to the output terminal OUT. Thus, the electric potential of the gate terminal GN1 of the transistor N1 is increased only in a certain period immediately after the falling edge of the input terminal IN and an initial driving ability of the transistor N1 is further intensified. Consequently, the electric potential of the output terminal OUT can instantaneously fall following the electric potential of the input terminal IN and a phase characteristic is improved.

Patent Document 1: Japanese Patent Laid-Open No. 6-216662

Patent Document 2: Japanese Patent Laid-Open No. 7-106871

Patent Document 3: Japanese Patent Laid-Open No. 11-249625

DISCLOSURE OF THE INVENTION

Problems to be Solved by the Invention

However, in the conventional load drive circuit, since the capacitors C1 and C2 are included in the phase compensators (13 and 14), there is a problem in that, when it is attempted to realize the load drive circuit as semiconductor integrated circuits, an integration degree cannot be sufficiently increased because an area occupied by the capacitors C1 and C2 on a chip is large and, as a result, it is difficult to hold down a price of an LSI chip.

Although it is possible to reduce the area occupied by the capacitors C1 and C2 by adopting a special process, in that case, it is impossible to hold down the price of the LSI chip because the cost is increased by the cost of the process itself.

The present invention has been devised in view of the problems and it is an object of the present invention to provide a load drive circuit that has a satisfactory phase characteristic and can be realized as a low-price LSI chip.

Those skilled in the art would easily understand other objects and operational effects of the present invention by referring to the following description of the specification.

Means for Solving the Problems

In order to solve the problems, a load drive circuit according to the present invention adopts a constitution described below.

The load drive circuit according to the present invention has a basic structure including an output terminal to which a load should be connected, an input terminal to which an input signal should be given, a final amplifier including an output element for driving the load, a preamplifier for driving an output element included in the final amplifier according to the input signal, and a phase compensator for improving a phase characteristic between input and output signal waveforms. An output signal of a non-inverting form appears in the output terminal according to the input signal given to the input terminal.

In the basic structure described above, the phase compensator is constituted by inserting series circuits of nonlinear resistive elements and switch elements between a control input terminal of the output element of the final amplifier and the output terminal of the load drive circuit. The nonlinear resistive element has a nonlinear characteristic in which a resistance value decreases as an applied voltage value increases and the resistance value increases as the applied voltage value decreases. The switch elements are switching-controlled to selectively come into an ON state only in a high-electric potential period or a low-electric potential period of the input signal according to whether the output element is arranged on a high-electric potential side or a low-electric potential side in the final amplifier.

According to the constitution described above, the switch element arranged on a high-electric potential side of the switch elements comes into the ON state only in the high-electric potential period of the input signal. On the other hand, the switch element arranged on a low-potential side of the switch elements comes into the ON state only in the low-electric potential period of the input signal.

Immediately after the electric potential of the input terminal changes from a low electric potential to a high electric potential, since an electric potential difference between the input and output terminal is large, a resistance value of the nonlinear resistive element is small. Therefore, the electric potential of the control input terminal of the high-electric potential side output element substantially falls following the electric potential of the output terminal. Consequently, a driving ability of the high-electric potential side output element is intensified and the electric potential of the output terminal steeply rises following the electric potential of the input terminal.

When the electric potential of the output terminal rises, since the electric potential difference between the input and output terminals decreases, the resistance value of the nonlinear resistive element increases. Thereafter, the electric potential of the control input terminal of the high-electric potential side output element takes a value controlled by an output of the preamplifier.

Immediately after the electric potential of the input terminal changes from a high electric potential to a low electric potential, since an electric potential difference between the input and output terminals is large, a resistance value of the nonlinear resistive element is small. Therefore, the electric potential of the control input terminal of the low-electric potential side output element substantially rises following the electric potential of the output terminal. Consequently, a driving ability of the low-electric potential side output element is intensified and the electric potential of the output terminal steeply falls following the electric potential of the input terminal.

When the electric potential of the output terminal falls, since the electric potential difference between the input and output terminals decreases, the resistance value of the nonlinear resistive element increases. Thereafter, the electric potential of the control input terminal of the high-electric potential side output element takes a value controlled by an output of the preamplifier.

As described above, according to the present invention, the electric potential of the output terminal steeply rises or falls following the electric potential of the input terminal well. It is possible to obtain a satisfactory phase characteristic between input and output waveforms. Since a capacitor is not included in the phase compensator, even when the phase compensator is realized as a semiconductor integrated circuit, high-density integration is possible and it is possible to manufacture an LSI chip at low cost.

In implementing the load drive circuit according to the present invention, it is possible to adopt various embodiments according to required specifications.

In an embodiment of the present invention, the nonlinear resistive element may be a transistor element that has a control input terminal and a pair of main terminals and is circuit-connected such that the electric potential of this control input terminal follows the electric potential of an output terminal of the load drive circuit. According to such a structure, it is possible to manufacture the nonlinear resistive element in conjunction with a manufacturing process for a transistor element and it is possible to cause, according to comparison of an electric potential difference between a control input terminal and an output terminal of the transistor and a forward direction threshold voltage of the transistor, the transistor to function not only as a resistive element but also as a switching element.

In an embodiment of the present invention, the final amplifier may be constituted by a complimentarily-connected pair of output elements. The series circuits may be inserted between a control input terminal of a high-electric potential side output element and an output terminal and between a control input terminal of a low-electric potential side output element and the output terminal, respectively.

In an embodiment of the present invention, the final amplifier may be constituted to connect a high-electric potential side output element and a load element or a low-electric potential side output element and a load element in series between a pair of power supply terminals and extract an output signal from a connection point thereof. The series circuits may be inserted between a control input terminal of the high-electric potential side output element and the output terminal or between a control input terminal of the low-electric potential side output element and the output terminal. In this case, the load element may be a constant current source constituted by one or two or more transistor elements.

In an embodiment of the present invention, the preamplifier may be an inverting amplifier that amplifies an electric potential difference between an input terminal and an output terminal and gives the electric potential difference to an output element of a final amplifier. In this case, the inverting amplifier may be a differential amplifier of a current mirror type in which a constant current source is inserted in a common current path.

In an embodiment of the present invention, the preamplifier may be a noninverting buffer circuit that amplifies an input signal and a pull resistive element may be inserted between a control input terminal and a power supply terminal of an output element. In this case, the noninverting buffer circuit may be a buffer circuit of a three-state type. The pull resistive element may be a poly resistor, a transistor element that has a control input terminal and a pair of main terminals and functions as a resistive element by making the control input terminal conductive to one of the pair of main terminals, or may be a constant current source constituted by one or two or more transistor elements.

The present invention may further include, in all the embodiments, a control input terminal and a circuit for enabling/disabling an operation of the preamplifier and/or the phase compensator according to a control input signal given to the control input terminal.

Advantageous Effect of the Invention

According to the load drive circuit of the present invention, the electric potential of the output terminal steeply rises or falls following the input terminal well and it is possible to obtain a satisfactory phase characteristic between input and output waveforms. Since a capacitor is not included in the phase compensator, even when the phase compensator is realized as a semiconductor integrated circuit, high-density integration is possible and it is possible to manufacture an LSI chip at low cost.

Best Mode for Carrying Out the Invention

Preferred embodiments of a load drive circuit according to the present invention will be hereinafter explained in detail with reference to the accompanying drawings.

A diagram of a load drive circuit (a first embodiment) according to the present invention is shown in FIG. 1. As shown in the figure, this load drive circuit includes an output terminal OUT to which a load (not shown) should be connected, an input terminal IN to which, for example, an input signal of a multi-valued form should be given, a final amplifier AMP0 including output elements for driving the load (a MOS field effect transistor P1 of a p-channel type (hereinafter simply referred to as "transistor P1") and a MOS field effect transistor N1 of an n-type (hereinafter simply referred to as "transistor N1")), preamplifiers (AMP1 and AMP2) for driving the output elements (the transistor P1 and the transistor N1) included in the final amplifier AMP0 according to the input signal, and phase compensators (a rising edge phase compensator 1 and a falling edge phase compensator 2) for improving a phase characteristic between input and output signal waveforms and is constituted such that an output signal of a non-inverting form appears according to the input signal given to the input terminal IN.

In this example, the final amplifier AMP0 is constituted by a complementarily-connected pair of output elements (the transistor P1 and the transistor N1). The output elements (the transistors P1 and N1) are biased such that the final amplifier AMP0 performs a class AB operation.

The preamplifier is constituted by a first inverting amplifier AMP1 that amplifies a electric potential difference between the input terminal IN and the output terminal OUT and gives the electric potential difference to a control input terminal (a gate terminal GP1) of a high-electric potential side output element (the transistor P1) of the final amplifier AMP0 and a second inverting amplifier AMP2 that amplifies an electric potential difference between the input terminal IN and the output terminal OUT and gives the electric potential difference to a control input terminal (a gate terminal GN1) of a low-electric potential side output terminal (the transistor N1) of the final amplifier AMP0.

The rising edge phase compensator 1 includes a series circuit of a p-channel type MOS field effect transistor P2 (hereinafter simply referred to as "transistor P2") functioning as a nonlinear resistive element and an n-channel type MOS field effect transistor N2 (hereinafter simply referred to as "transistor N2") functioning as a switch element, which are inserted between the control input terminal (the gate terminal GP1) of the high-electric potential side output element (the transistor P1) and the output terminal OUT.

More specifically, a source terminal of the transistor P2 is connected to the gate terminal GP1 of the transistor P1, a gate terminal of the transistor P2 is connected to the output terminal OUT through a drain terminal DP1 of the transistor P1, and a drain terminal of the transistor P2 is connected to the output terminal OUT via the transistor N2 having a switch function.

Therefore, a conduction resistance of the transistor P2 changes in an ON state of the switch element (N2) according to an electric potential difference between the gate terminal GP1 of the transistor P1 and the output terminal OUT, i.e., a source to drain voltage (an applied voltage) of the transistor P2, whereby a function of the nonlinear resistive element is realized.

On the other hand, a gate terminal of the transistor N2 functioning as the switch element is connected to the input terminal IN and a source terminal thereof is connected to the output terminal OUT. Therefore, the transistor N2 is selectively turned on only in a period in which the electric potential of the input terminal IN is higher than the electric potential of the output terminal OUT by electric potential equal to or larger than an input threshold voltage Vth of the transistor N2, whereby a switch function for rectification is realized.

The falling edge phase compensator 2 includes a series circuit of an n-channel type MOS electric field effect transistor N3 (hereinafter simply referred to as "transistor N3") functioning as a nonlinear resistive element and a p-channel type MOS electric field effect transistor P3 (hereinafter simply referred to as "transistor P3") functioning as a switch element, which are inserted between the control input terminal (GN1) of the low-electric potential side output terminal (the transistor N1) and the output terminal OUT.

More specifically, a source terminal of the transistor N3 is connected to the gate terminal GN1 of the transistor N1, a gate terminal of the transistor N3 is connected to the output terminal OUT through a drain terminal DN1 of the transistor N1, and a drain terminal of the transistor N3 is connected to the output terminal OUT via the transistor P3 having a switch function.

Therefore, a conduction resistance of the transistor P3 changes in an ON state of the switch element (P3) according to an electric potential difference between the gate terminal GN1 of the transistor N1 and the output terminal OUT, i.e., a source to drain voltage (an applied voltage) of the transistor N3, whereby a function of the nonlinear resistive element is realized.

On the other hand, a gate terminal of the transistor P3 functioning as the switch element is connected to the input terminal IN. Therefore, the transistor P3 is selectively turned on only in a period in which the electric potential of the input terminal IN is lower than the electric potential of the output terminal OUT by electric potential equal to or larger than the input threshold voltage Vth of the transistor N2, whereby a switch function for rectification is realized.

A waveform chart (the first embodiment) showing signal waveforms of respective sections of the load drive circuit is shown in FIG. 2. As shown in the figure, when the electric potential of the input terminal IN changes from a low electric potential to a high electric potential, the first inverting amplifier AMP1 attempts to lower the electric potential of the gate terminal GP1 of the transistor P1 arranged on a high-electric potential side and increase a driving ability of the transistor P1 and the second inverting amplifier AMP2 attempts to lower the electric potential of the gate terminal GN1 of the transistor N1 and decrease a driving ability of the transistor N1 such that the electric potential of the output terminal OUT becomes the same as the electric potential of the input terminal IN.

At this point, the transistor N2 having the switch function included in the rising edge phase compensator 1 is on because the electric potential of the input terminal IN is a high electric potential. The transistor P2 having a variable resistance function shows an ON state and a low resistance value (a low ON resistance state) because the electric potential of the output terminal OUT is still a low electric potential. Therefore, the phase compensator 1 is brought into an active state and dynamically lowers the electric potential of the gate electrode GP1 of the transistor P1, whereby the driving ability of the transistor P1 is drastically intensified. As a result, the electric potential of the output terminal OUT can steeply rise following the electric potential of the input terminal IN well.

As the electric potential of the output terminal OUT changes from a low electric potential to a high electric potential, an ON resistance value of the transistor P2 gradually increases to control the electric potential of the gate terminal GP1 of the transistor P1 and adjust the driving ability.

When the electric potential of the output terminal OUT is higher than the electric potential of the input terminal IN lowered by an ON threshold voltage Vth of the transistor N2, the transistor N2 is switched from the ON state to an OFF state.

Thereafter, the electric potential control of the gate terminal GP1 of the transistor P1 is switched to the control by the first inverting amplifier AMP1 and the electric potential of the output terminal OUT is controlled to be the same as the electric potential of the input terminal IN.

During the rising operation of the input signal explained above, the electric potential of the output terminal OUT does not become higher than the electric potential of the input terminal IN by the input threshold voltage Vth of the transistor P3. Thus, the transistor P3 is maintained in the OFF state and the falling edge phase compensator 2 is maintained in a disabled state.

On the other hand, as shown in FIG. 2, when the electric potential of the input terminal IN changes from a high electric potential to a low electric potential, the first inverting amplifier AMP1 attempts to raise the electric potential of the gate terminal GP1 of the transistor P1 and reduce the driving ability of the transistor P1 and the second inverting amplifier AMP2 attempts to raise the electric potential of the gate terminal GN1 of the transistor N1 and increase the driving ability of the transistor N1 such that the electric potential of the output terminal OUT becomes the same as the electric potential of the input terminal IN.

At this point, the transistor P3 having the switch function included in the falling edge phase compensator 2 is on because the electric potential of the input terminal IN is a low electric potential. The transistor N3 having the variable resistance function shows an ON state and a low resistance value (a low ON resistance state) because the electric potential of the output terminal OUT is still a low electric potential. Therefore, the falling edge phase compensator 2 is brought into an active state and dynamically raises the electric potential of the gate terminal GN1 of the transistor N1, whereby the driving ability of the transistor N1 is drastically intensified. As a result, the electric potential of the output terminal OUT can steeply rise following the electric potential of the input terminal IN well.

As the electric potential of the output terminal OUT changes from a low electric potential to a high electric potential, an ON resistance value of the transistor N3 gradually increases to control the electric potential of the gate terminal GN1 of the transistor N1 and adjust the driving ability.

When the electric potential of the output terminal OUT is lower than the electric potential of the input terminal IN raised by the ON threshold voltage Vth of the transistor P3, the transistor P3 is switched from the ON state to the OFF state.

Thereafter, the electric potential control of the gate terminal GN1 of the transistor N1 is switched to the control by the second inverting amplifier AMP2 and the electric potential of the output terminal OUT is controlled to be the same as the electric potential of the input terminal IN.

During the rising operation of the input signal explained above, the electric potential of the output terminal OUT does not become lower than the electric potential of the input terminal IN by the input threshold voltage Vth of the transistor N2. Thus, the transistor N2 is maintained in the OFF state and the rising edge phase compensator 1 is maintained in the disabled state.

Performance of the phase compensator in the load drive circuit of the present invention and performance of the phase compensator in the conventional load drive circuit are compared and explained. A graph showing a comparative simulation result of the conventional phase compensator and the phase compensator of the present invention at the time when a load capacity is a light load (15 pF) is shown in FIG. 3. A comparative simulation result of the conventional phase compensator and the phase compensator of the present invention at the time when a load capacity is a heavy load (150 pF) is shown in FIG. 4.

As it is evident from the figures, it is seen that, in both the simulation results at the time of the light load (15 pF) and the heavy load (150 pF), a delay time of a change in the output terminal OUT with respect to a change in the input terminal IN is short and a phase margin is large in the phase compensator of the present invention compared with the conventional phase compensator.

Concerning occupied areas on chips of both the circuits, whereas the capacitance of the capacitors C1 and C2 of the conventional phase compensator used in this simulation are 2 pF and this capacitance is represented as about 4000 μm² in terms of a layout area, a layout area of the phase compensator of the present invention is about 50 μm². It has been confirmed that the occupied area on the chip of the phase compensator of the present invention can be reduced to be equal to or smaller than 1/80 of the occupied area on the chip of the conventional phase compensator.

In this way, in the load drive circuit according to the first embodiment, in addition to the high phase margin compared with that of the conventional load drive circuit, a capacitor having a large occupied area on a chip is not used as the phase compensator. Thus, it is possible to realize a high integration degree compared with the conventional load drive circuit including the capacitance in the load compensator and it is possible to manufacture an LSI chip of this type at low cost.

The load drive circuit of the present invention can be realized in various embodiments by changing, while maintaining the basic structure of the phase compensator, structures of peripheral circuits thereof.

Another embodiment (a second embodiment) of the load drive circuit having the phase compensation function is shown in FIG. 5. In this embodiment, the final amplifier and the preamplifier are altered.

In this embodiment, the final amplifier AMP0 is constituted by series-connecting the transistor P1 on the high-electric potential side and the constant current source I0 on the low-electric potential side between a pair of power supply terminals VDD and GND and leading out a connection point thereof to the output terminal OUT. The constant current source I0 is constituted by one or two or more transistor elements. The preamplifier AMP3 is constituted by a differential amplifier of the current mirror type in which a constant current source is inserted in a common current path on the low-electric potential side. The phase compensator 1 is constituted by inserting a series circuit of the transistor P2 functioning as the nonlinear resistive element and the transistor N2 functioning as the switch element between the gate terminal GP1 of the transistor P1 on the high-electric potential side of the final amplifier AMP0 and the output terminal of the final amplifier AMP0.

Still another embodiment (a third embodiment) of the load drive circuit having the phase compensation function is shown in FIG. 6. In this embodiment, as in the above embodiment, the final amplifier and the preamplifier are altered.

In this embodiment, the final amplifier AMP0 is constituted by series-connecting the constant current source I0 on the high-electric potential side and the transistor N1 on the low-electric potential side between the pair of power supply terminals VDD and GND and leading out a connection point thereof to the output terminal OUT. The constant current source I0 is constituted by one or two or more transistor elements.

A preamplifier AMP4 is constituted by a differential amplifier of the current mirror type in which a constant current source is inserted in a common current path on the high-electric potential side.

The phase compensator 2 is constituted by inserting the series circuit of the transistor P3 functioning as the nonlinear resistive element and the transistor N3 functioning as the switch element between the gate terminal GN1 of the transistor N1 on the low-electric potential side of the final amplifier AMP0 and the output terminal OUT of the final amplifier AMP0.

Still another embodiment (a fourth embodiment) of the load drive circuit having the phase compensation function is shown in FIG. 7. In this embodiment, the phase compensator and the preamplifier are altered.

Concerning the rising edge phase compensator 3, a p-channel type MOS field effect transistor P4 (hereinafter simply referred to as "transistor P4") functioning as a switch element is connected between the transistor P2 functioning as the nonlinear resistive element and the power supply terminal VDD.

An n-channel MOS field effect transistor N5 (hereinafter simply referred to as "transistor N5") functioning as a switch element is connected between the transistor P2 functioning as the nonlinear resistive element and the transistor N2 functioning as the switch element.

As the first inverting amplifier AMP1, an amplifier with an enable terminal is adopted.

Each of a gate terminal of the transistor P4, a gate terminal of the transistor N5, and the enable terminal of the first inverting amplifier AMP1 is connected to a control input terminal CNT via a inverter NOT.

On the other hand, concerning the falling edge phase compensator 4, an n-channel type MOS field effect transistor N4 (hereinafter simply referred to as "transistor N4") functioning as a switch element is connected between the transistor N3 functioning as the nonlinear resistive element and the ground terminal GND.

A p-channel type MOS field effect transistor P5 (hereinafter simply referred to as "transistor P5") functioning as a switch element is connected between the transistor N3 functioning as the nonlinear resistive element and the transistor P3 functioning as the switch element.

As the second inverting amplifier AMP2, an amplifier with an enable terminal is adopted.

Each of a gate terminal of the transistor N4, a gate terminal of the transistor P5, and the enable terminal of the second inverting amplifier AMP2 is connected to the control input terminal CNT not via the inverter NOT.

Therefore, when a high electric potential ("H") is supplied to the control input terminal CNT, the transistors P4 and N4 come into the ON state, the transistors N5 and P5 come into the OFF state, and both the transistors P1 and N1 constituting the final amplifier AMP0 are turned off, whereby the electric potential of the output terminal OUT of the circuit comes into a high impedance state. On the other hand, when a low voltage ("L") is supplied to the control input terminal CNT, the transistors P4 and N4 come into the OFF state, the transistors N5 and P5 come into the ON state, and the electric potential of the output terminal of the circuit is determined according to the electric potential of the input terminal IN. As a result, this load drive circuit is formed as a load drive circuit of a three-state output type.

Still another embodiment (a fifth embodiment) of the load drive circuit having the phase compensation function is shown in FIG. 8. In this embodiment, the phase compensator and the preamplifier are altered.

Concerning the phase compensator 5 on the high-electric potential side, a p-channel type MOS field effect transistor P6 (hereinafter simply referred to as "transistor P6") functioning as a pull-up resistor is connected between the gate terminal GP1 of the transistor P1 and the power supply terminal VDD. Concerning the phase compensator 6 on the low-electric potential side, an n-channel type MOS field effect transistor N6 (hereinafter referred to as "transistor 6") functioning as a pull-down resistor is connected between the gate terminal GN1 of the transistor N1 and the ground germinal GND. On the other hand, as a preamplifier, a non-inverting buffer amplifier BFR1 is adopted.

Therefore, when the electric potential of the input terminal IN changes from a low electric potential to a high electric potential, the transistor N2 is turned on, whereby the electric potential of the gate terminal GP1 of the transistor P1 suddenly falls from the power supply electric potential VDD and intensifies the driving ability of the transistor P1. On the other hand, when the electric potential of the input terminal IN changes from a high electric potential to a low electric potential, the transistor P3 is turned on, whereby the electric potential of the gate terminal GN1 of the transistor N1 suddenly rises from the ground electric potential GND and intensifies the driving ability of the transistor N1.

Still another embodiment (a sixth embodiment) of the load drive circuit having the phase compensation function is shown in FIG. 9. This sixth embodiment is the same as the structure of the fifth embodiment except that a pull-up resistor is realized by a poly resistive element R3 and a pull-down resistor is realized by a poly resistive element R4.

Still another embodiment (a seventh embodiment) of the load drive circuit having the phase compensation function is shown in FIG. 10. This seventh embodiment is the same as the structure of the fifth embodiment except that, concerning the rising edge phase compensator 9, a pull-up resistor is realized by a constant current source 11 and, concerning the falling edge phase compensator 10, a pull-down resistor is realized by a constant current source 12.

Still another embodiment (an eighth embodiment) of the load drive circuit having the phase compensation function is shown in FIG. 11. In this embodiment, the phase compensator and the preamplifier are altered.

Concerning the rising edge phase compensator 11, an n-channel type MOS electric field effect transistor N7 (hereinafter simply referred to as "transistor N7") functioning as a switch element is connected between the transistor N2 having the switch function and the output terminal OUT. Concerning the falling edge phase compensator 12, a p-channel type MOS electric field effect transistor P7 (hereinafter simply referred to as "transistor P7") functioning as a switch element is connected between the transistor P3 having the switch function and the output terminal OUT. As the preamplifier, a non-inverting buffer amplifier BFR2 with an enable terminal is adopted.

A gate terminal of the transistor N7 and the enable terminal of the buffer amplifier BFR2 are connected to the control input terminal CNT and a gate terminal of the transistor P7 is connected to the control input terminal CNT via the inverter NOT.

Therefore, in a state in which the electric potential of the control input terminal CNT is low ("L"), both the transistors N7 and P7 come into the OFF state. Thus, both the pair of transistors P1 and N1 included in the final amplifier AMP0 come into the OFF state, the buffer amplifier BFR2 is disenabled, and the output terminal OUT comes into a high impedance state.

On the other hand, in a state in which the electric potential of the control input terminal CNT is high ("H"), the buffer amplifier BRF2 is enabled and one of the pair of transistors N2 and P3 is turned on. Thus, since the electric potential of the output terminal OUT depends on the electric potential of the input terminal IN, this load drive circuit is formed as a load drive circuit of a three-state output type.

According to the embodiments described above, the elements (P2 and P3) having the variable resistance function and the rectifying elements (N2 and P3) capable of performing voltage control are provided instead of the resistors (R1 and R2) and the capacitors (C1 and C2). The rectifying elements (N2 and P3) perform an action for controlling ON and OFF of the phase compensator and the elements (P2 and P3) having the variable resistance function dynamically control a gate voltage of the output MOS transistors (P1 and N1) and control the driving ability of the output MOS transistors. Thus, it is possible to substantially reduce an area occupied by the phase compensator and realize a circuit having a high-performance output characteristic with less shift of phases with respect to a wide range of loads at low cost.

In other words, according to the present invention, it is possible to reduce, with a simple structure and without requiring a special process having a high capacitance, a chip area of an integrated circuit using an inexpensive process and it is possible to provide a high-performance circuit with less shift of phases with respect to a wide range of loads at low cost. In particular, in the present invention, it is possible to substantially reduce a chip area of an integrated circuit without using a capacitor and it is possible to provide a low-price integrated circuit. Since the element that can dynamically control a gate voltage of the output MOS transistor is used instead of the capacitor, the output transistor has a driving ability capable of coping with a wide range of loads and it is possible to perform phase compensation without causing ringing. Moreover, when it is attempted to obtain the same performance, it is possible to substantially reduce not only the phase compensator but also the output transistor and it is possible to reduce an area of a chip.

Industrial Applicability

According to the load drive circuit of the present invention, the electric potential of the output terminal steeply rise or fall following the electric potential of the input terminal well and it is possible to obtain a satisfactory phase characteristic between input and output waveforms. Further, since a capacitor is not included in the phase compensator, even when the phase compensator is realized as a semiconductor integrated circuit, high density integration is possible and it is possible to manufacture an LSI chip at low cost.

DESCRIPTION OF SYMBOLS

Figure 1:
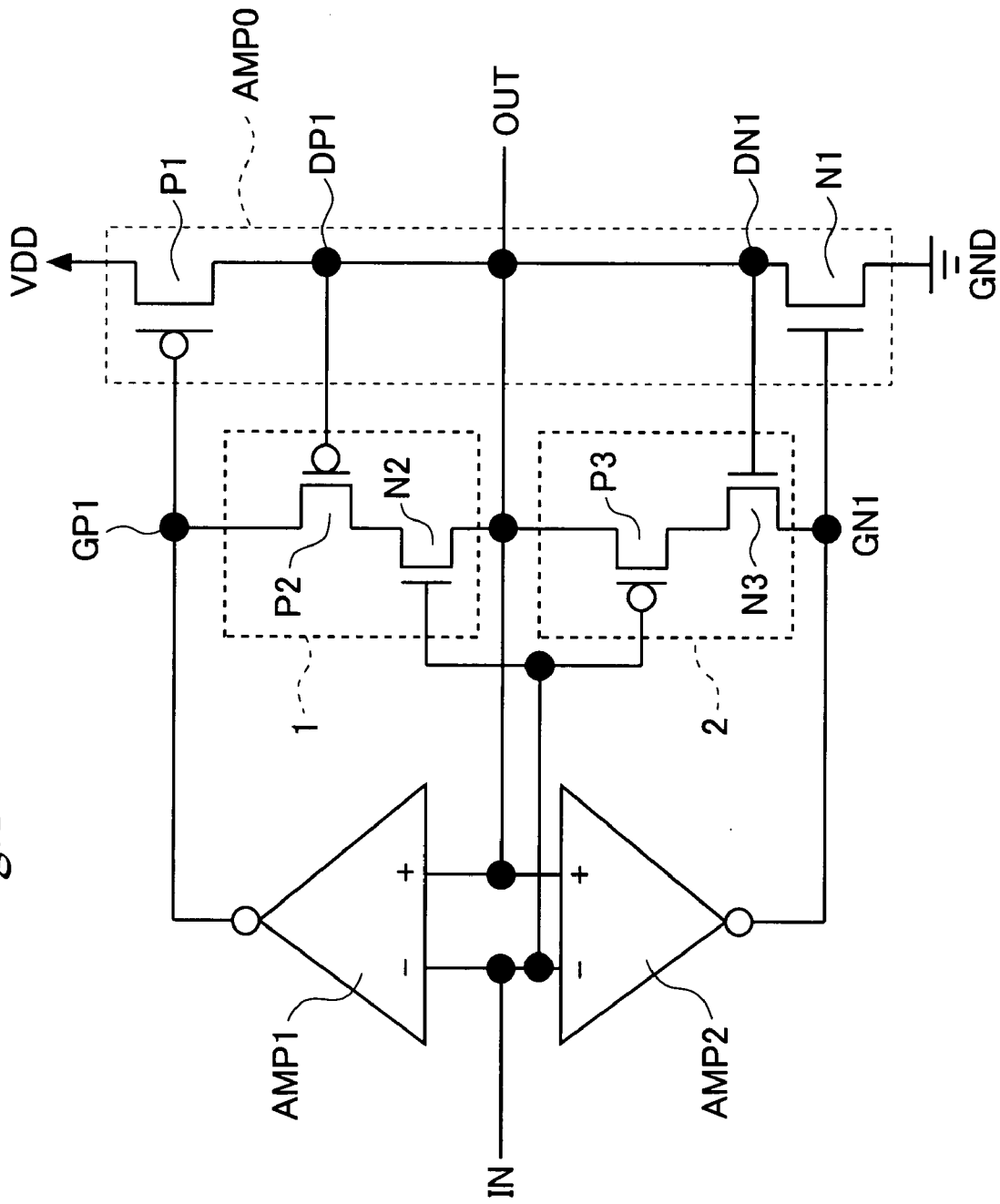
FIG. 1 is a diagram of a load drive circuit having a phase compensation function (a first embodiment)
Figure 2:
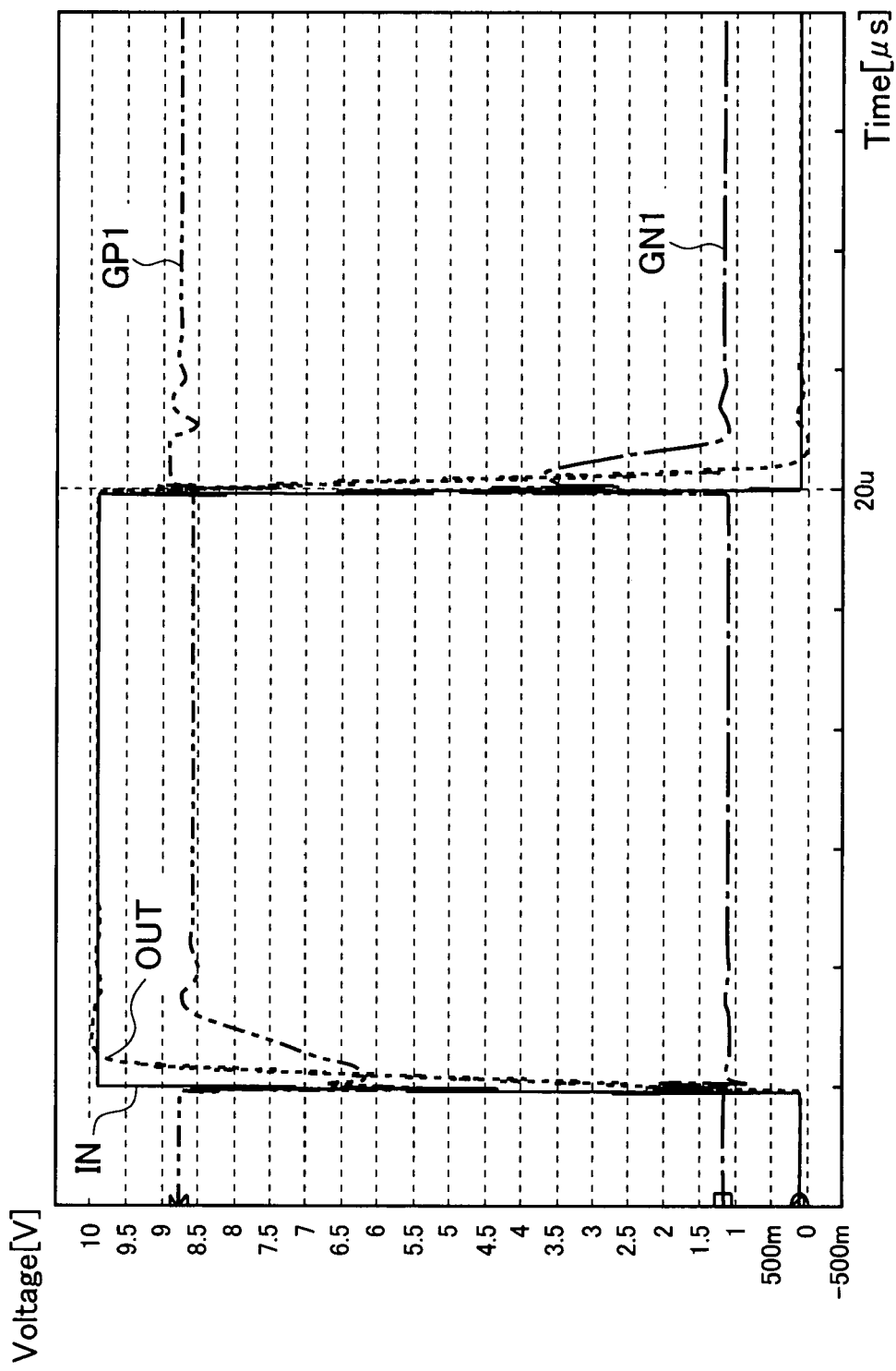
FIG. 2 is a waveform chart showing signal waveforms of respective sections of the load drive circuit (the first embodiment)
Figure 3:
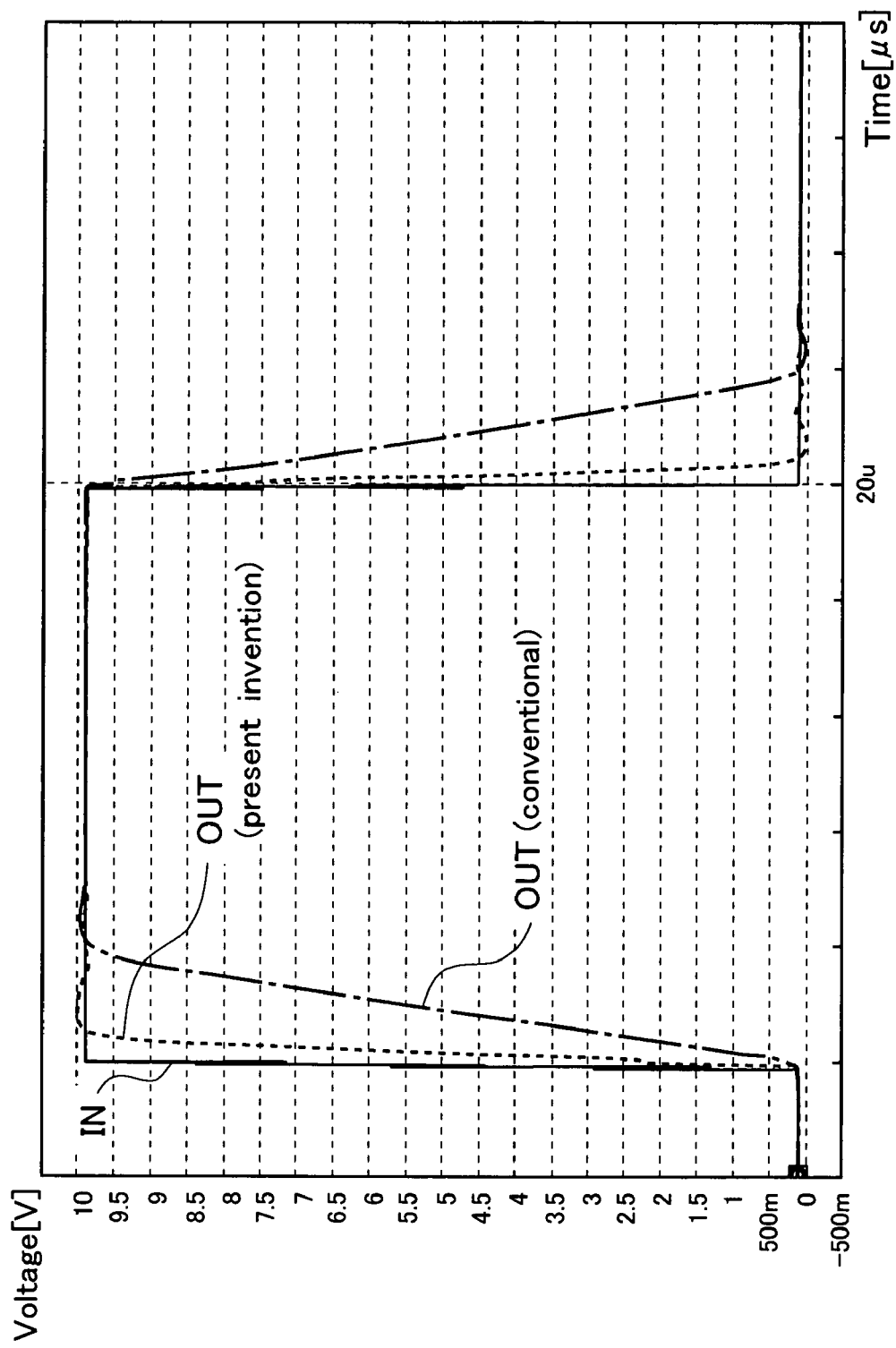
FIG. 3 is a comparative simulation waveform chart of the phase compensation function at a light load (15 pF)
Figure 4:
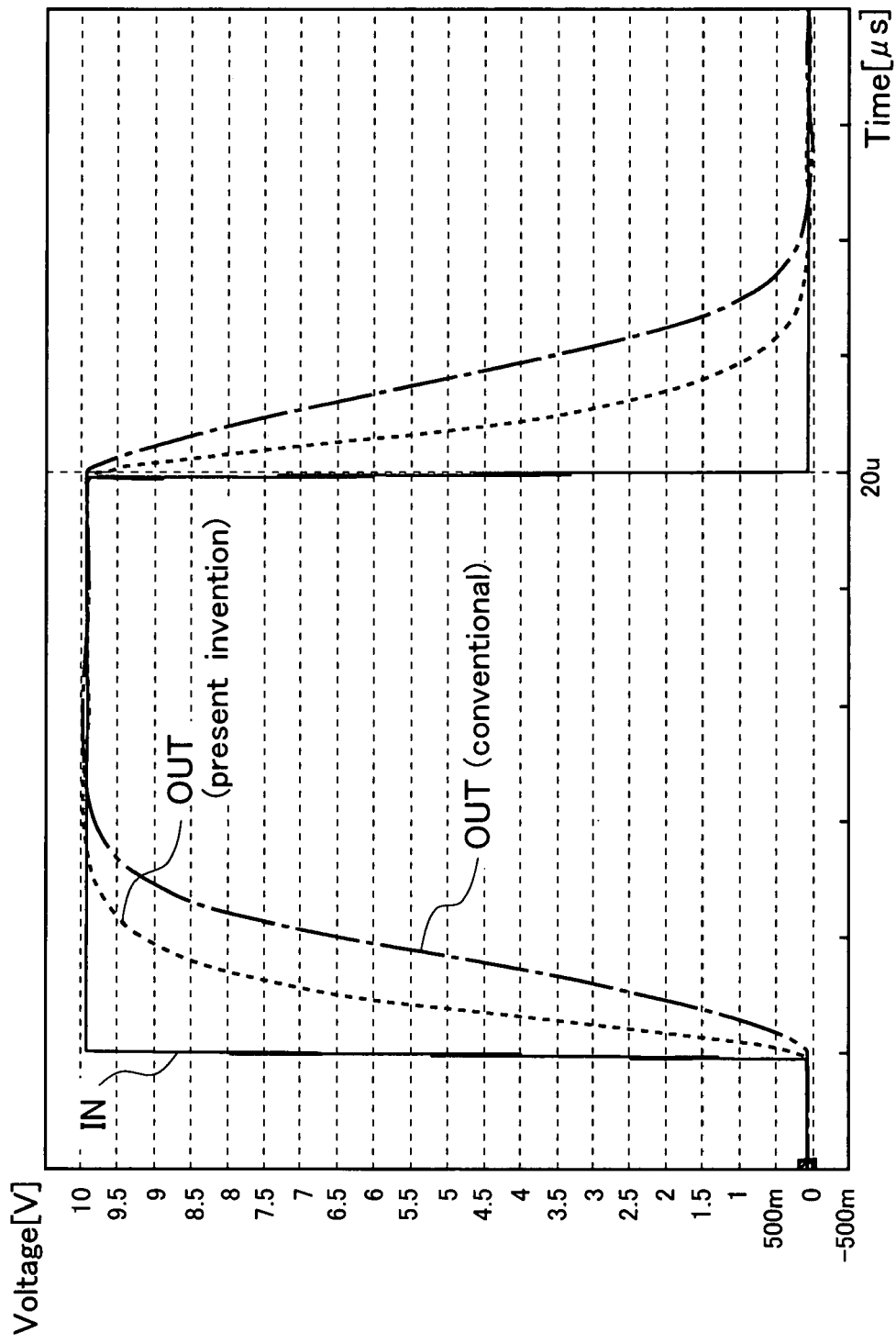
FIG. 4 is a comparative simulation waveform chart of the phase compensation function at a heavy load (150 pF)
Figure 5:
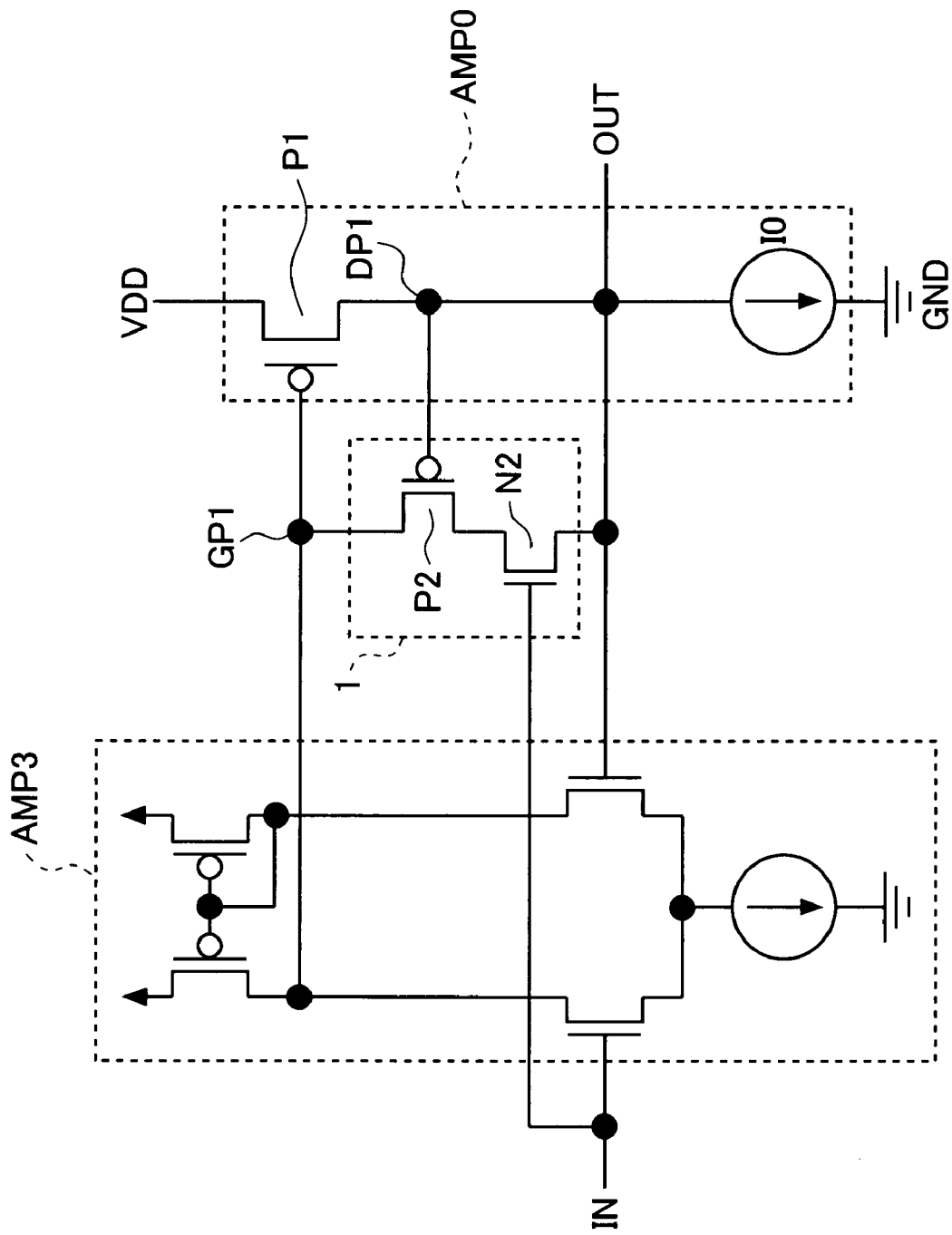
FIG. 5 is a diagram of a load drive circuit having a phase compensation function (a second embodiment)
Figure 6:
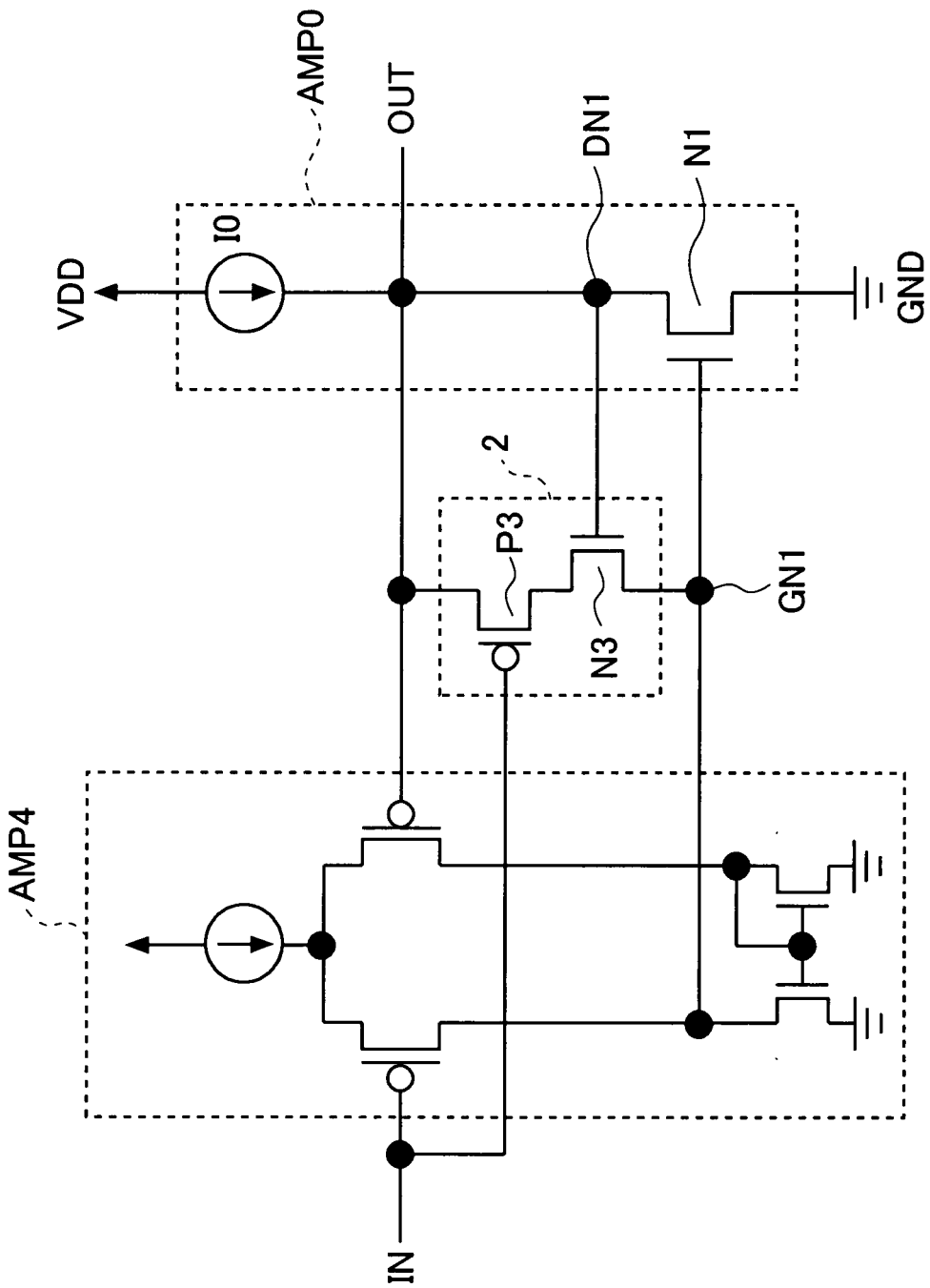
FIG. 6 is a diagram of a load drive circuit having a phase compensation function (a third embodiment)
Figure 7:
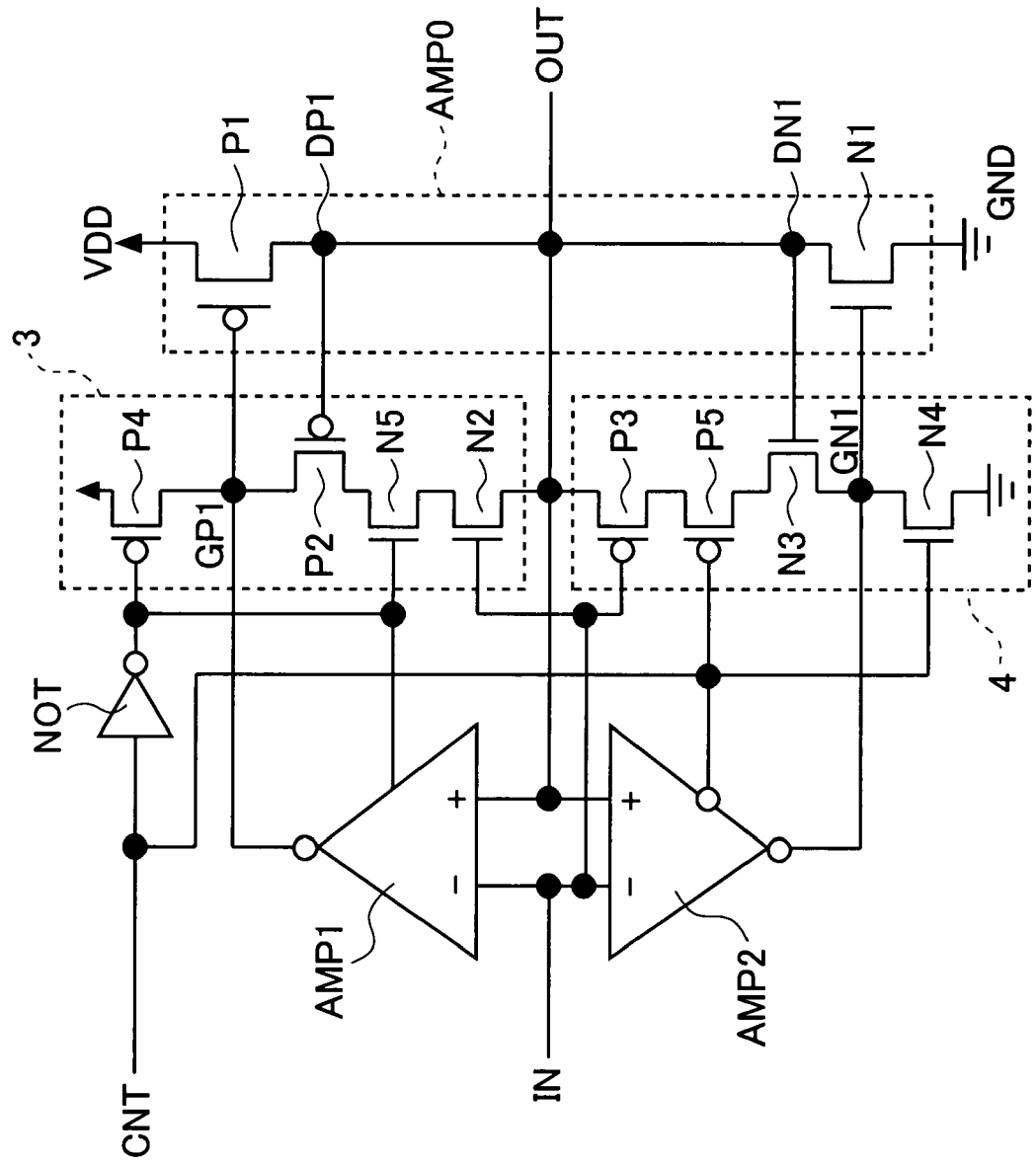
FIG. 7 is a diagram of a load drive circuit having a phase compensation function (a fourth embodiment)
Figure 8:
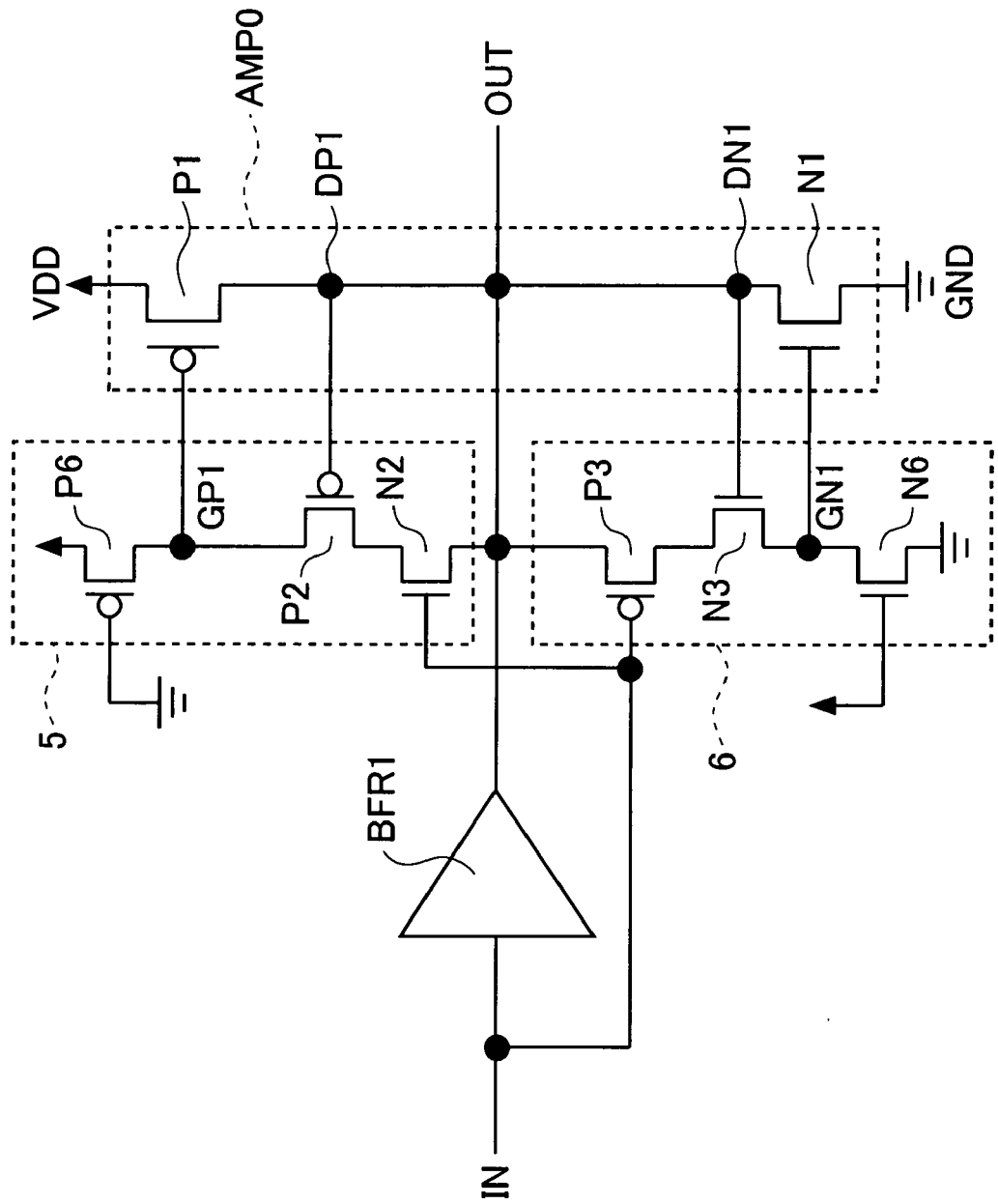
FIG. 8 is a diagram of a load drive circuit having a phase compensation function (a fifth embodiment)
Figure 9:
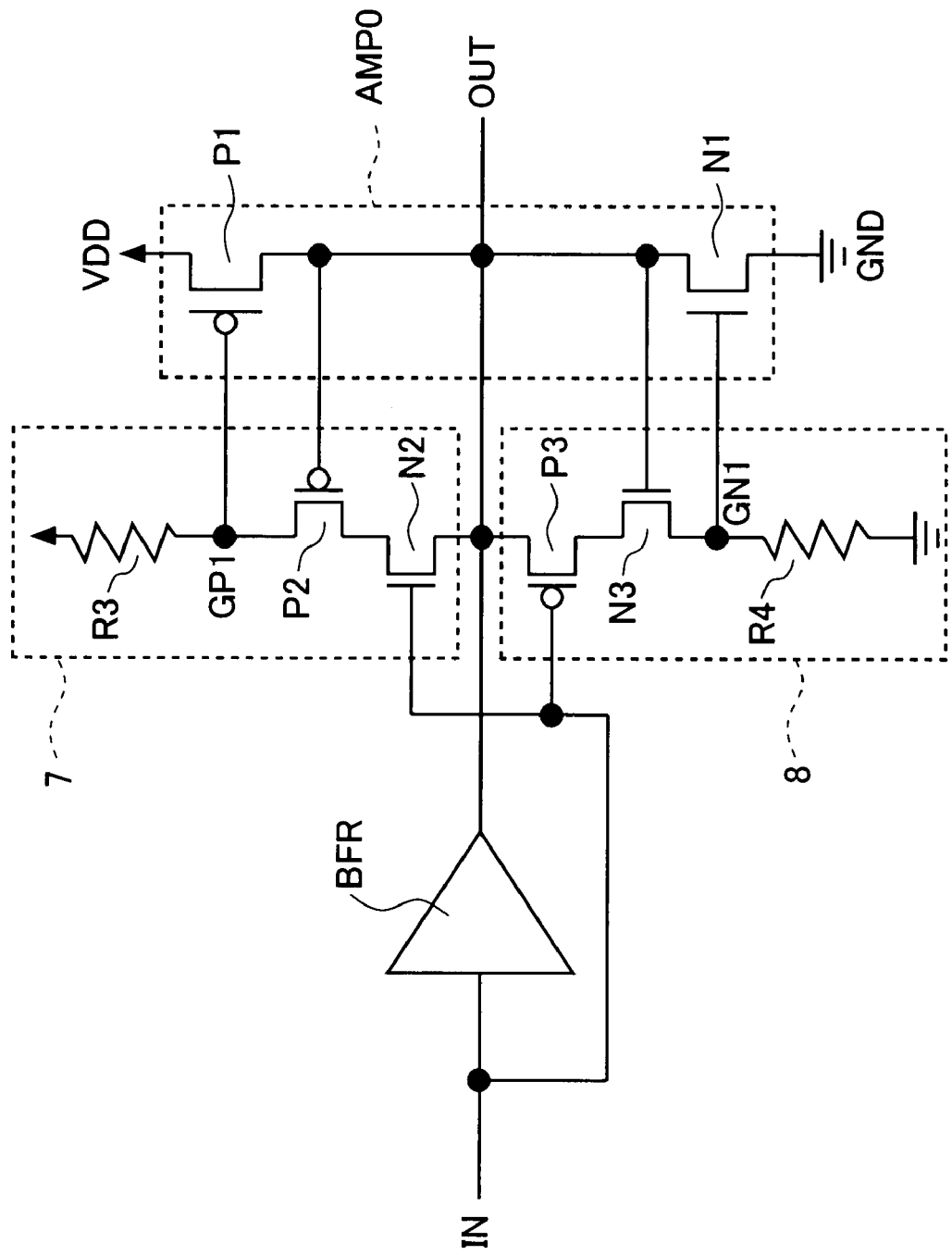
FIG. 9 is a diagram of a load drive circuit having a phase compensation function (a sixth embodiment)
Figure 10:
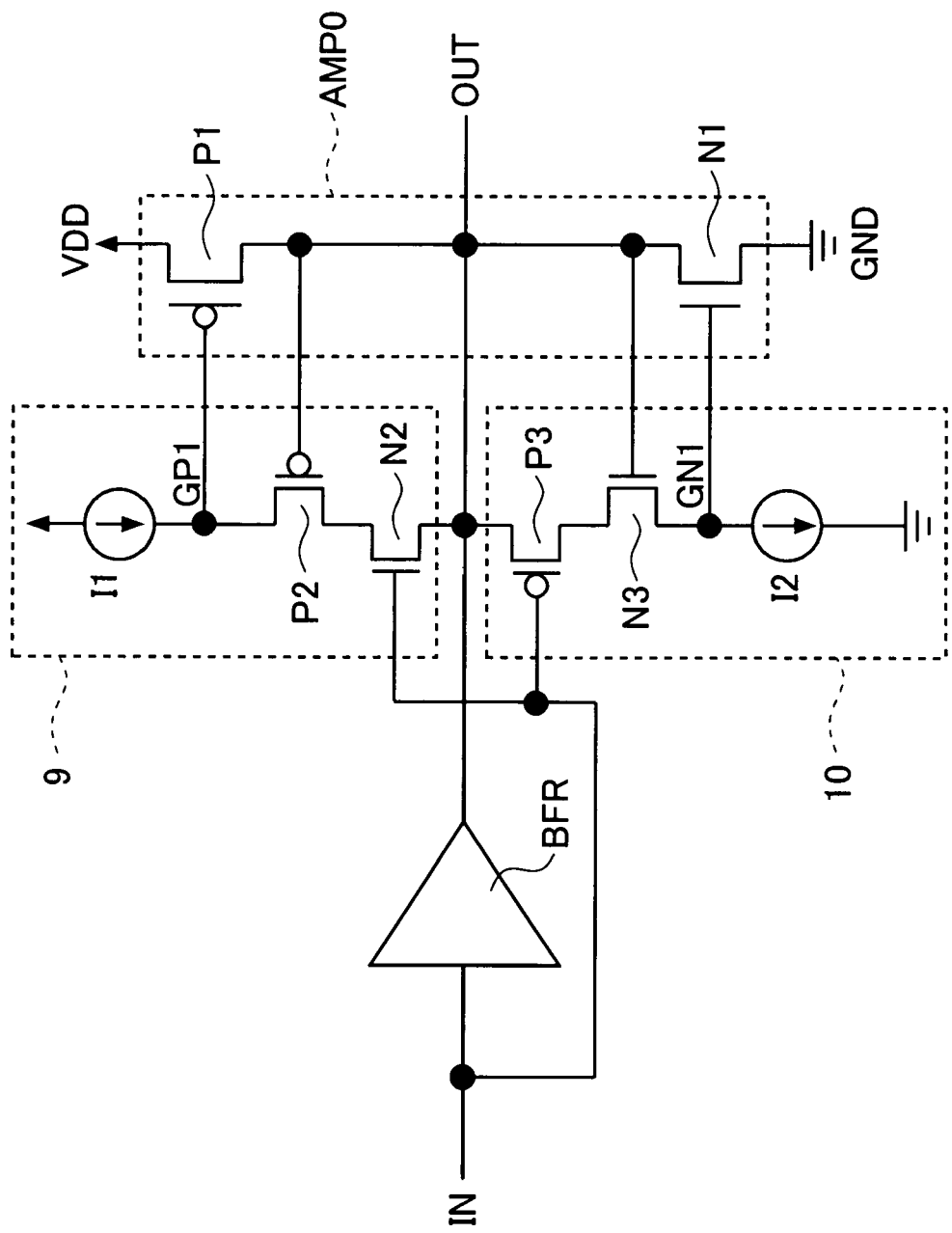
FIG. 10 is a diagram of a load drive circuit having a phase compensation function (a seventh embodiment)
Figure 11:
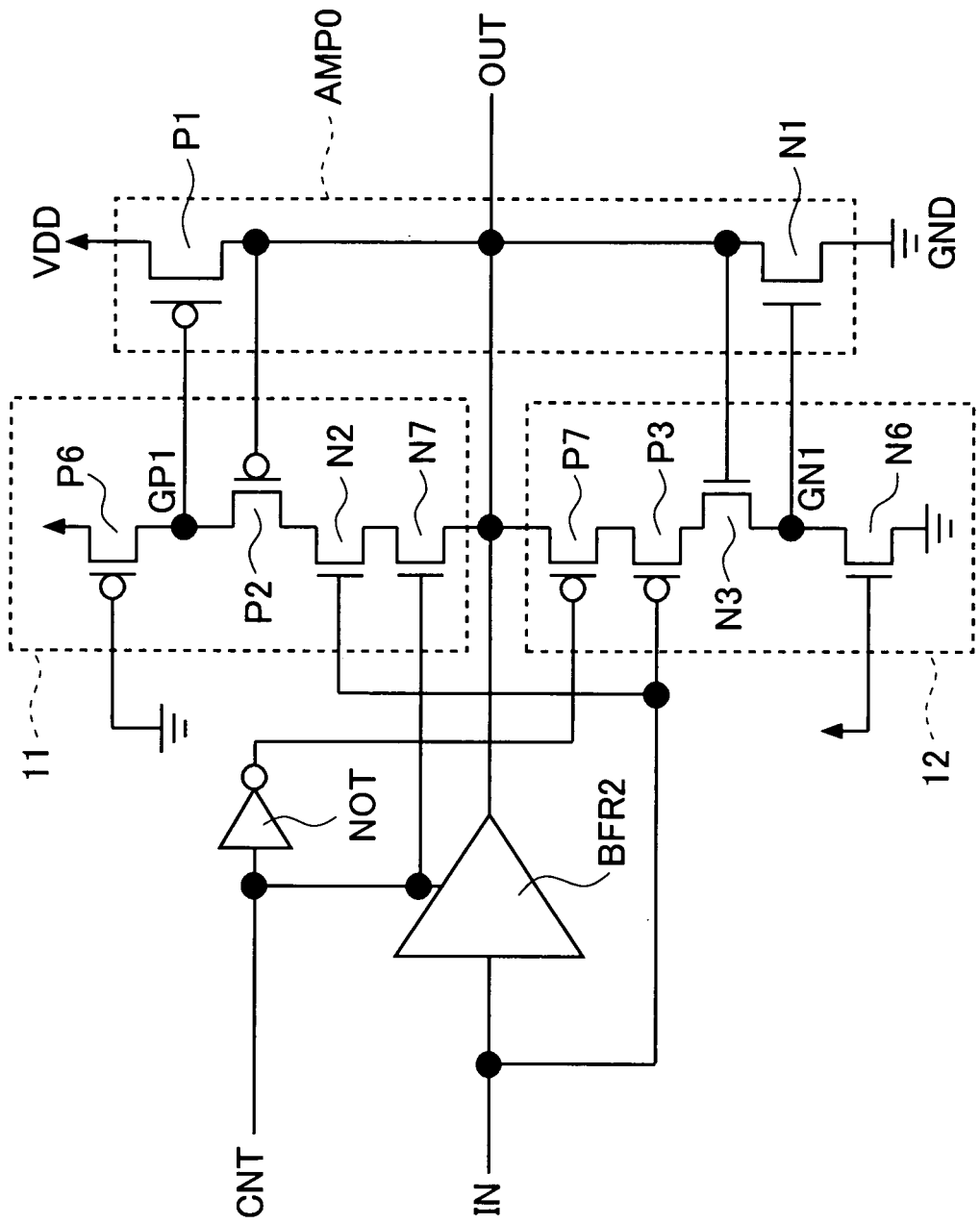
FIG. 11 is a diagram of a load drive circuit having a phase compensation function (an eighth embodiment)
Figure 12:
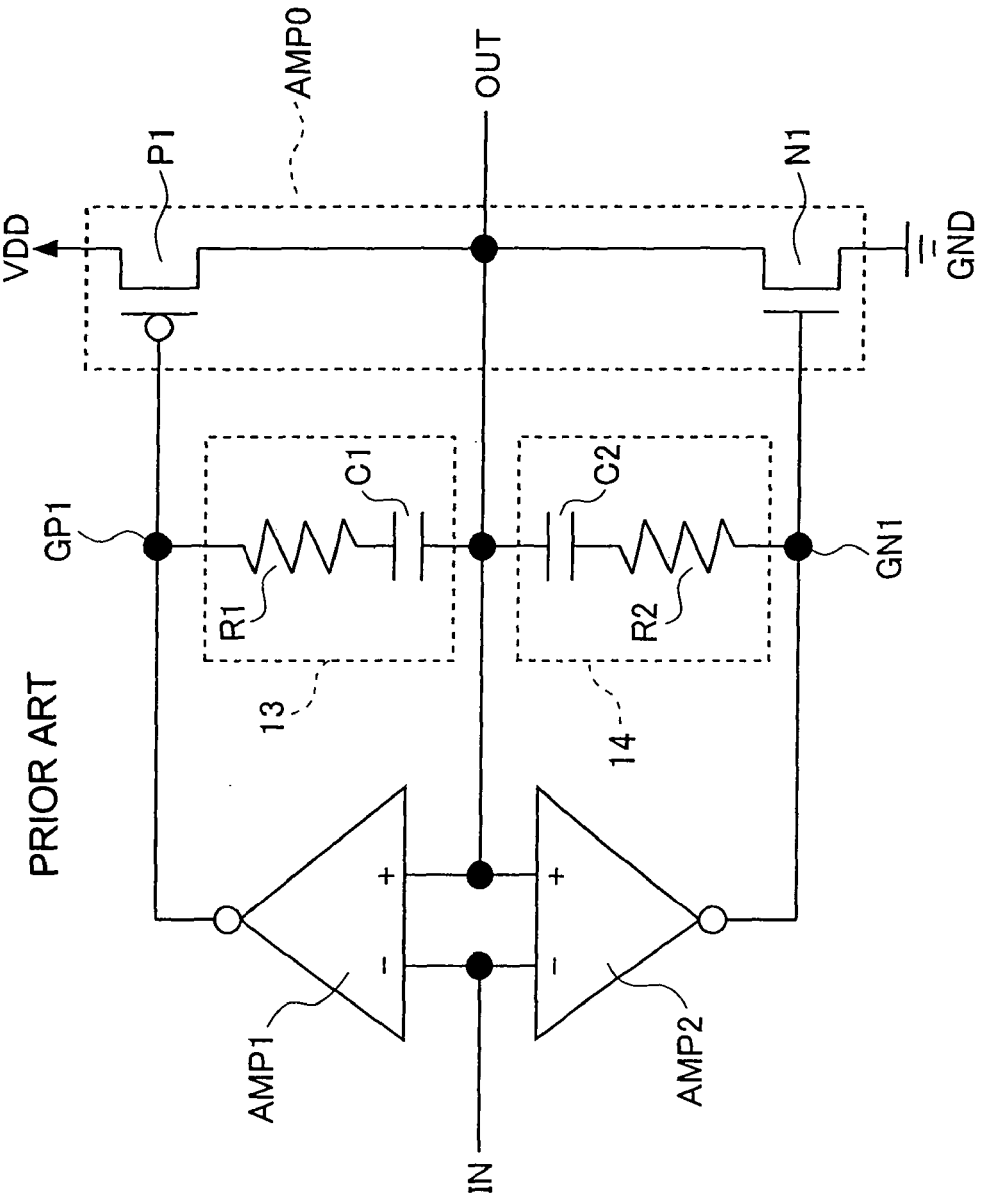
FIG. 12 is a diagram of a load drive circuit having a phase compensation function (a conventional example)
Figure 13:
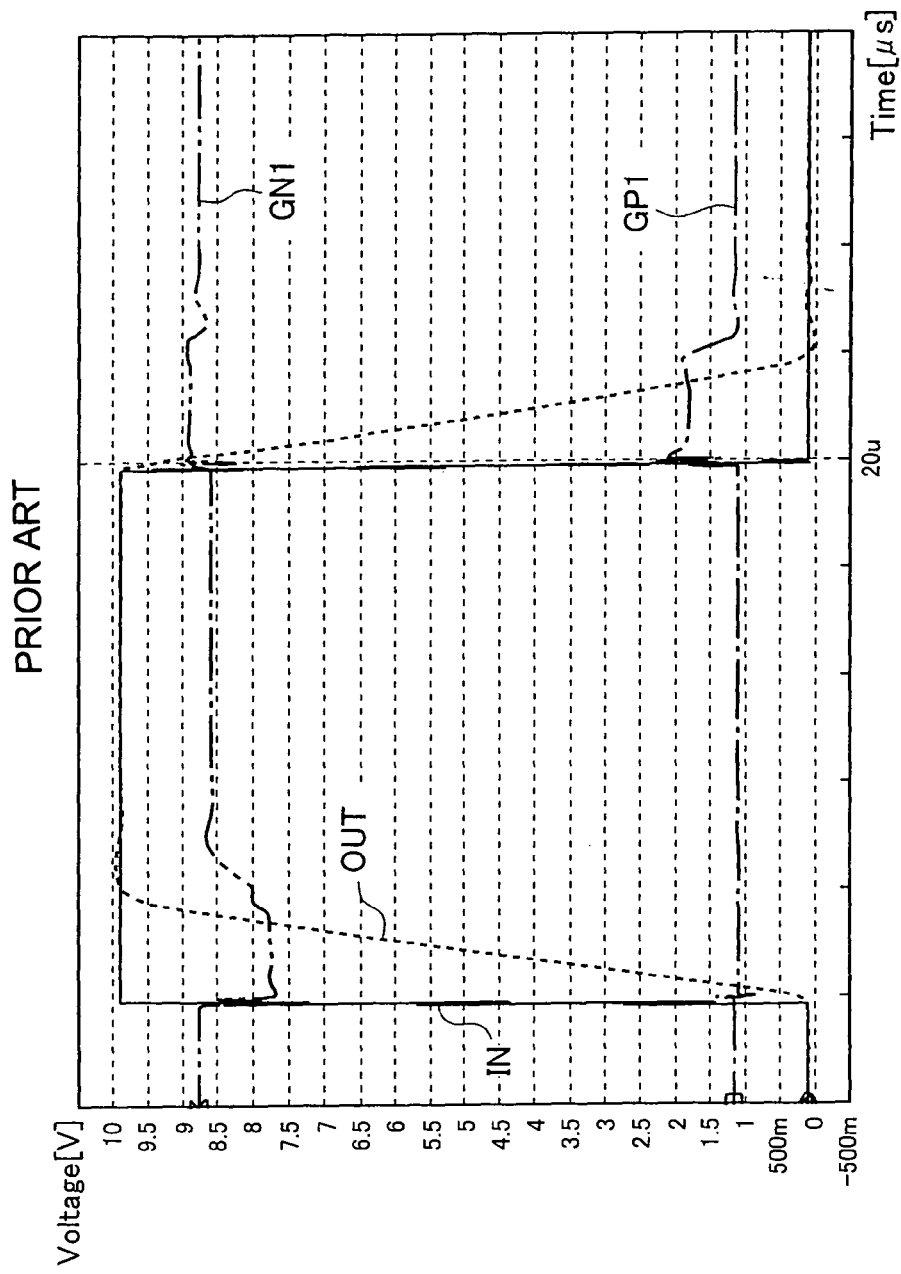
FIG. 13 is a waveform chart showing signal waveforms of respective sections of the load drive circuit (a conventional example).

AMP0 Final amplifier
P1 P-channel type MOS field effect transistor (output element)

N1 P-channel type MOS field effect transistor (output element)
1, 3, 5, 7, 9, 11, 13 Rising edge phase compensators
2, 4, 6, 8, 10, 12, 14 Falling edge phase compensators
OUT Output terminal
IN Input terminal
GP1 Gate terminal (control input terminal of output element)
GN1 Gate terminal (control input terminal of output element)
AMP1 First inverting amplifier
AMP2 Second inverting amplifier
AMP3 Inverting differential amplifier of a current mirror type
AMP4 Inverting differential amplifier of a current mirror type
CNT Control input terminal
BFR1 Noninverting buffer amplifier
BFR2 Noninverting buffer amplifier (with an enable terminal)

The invention claimed is:

1. A load drive circuit comprising:
an output terminal to which a load should be connected;
an input terminal to which an input signal should be given;
a final amplifier including an output element for driving the load;
a preamplifier for driving the output element included in the final amplifier according to the input signal; and
a phase compensator for improving a phase characteristic between input and output signal waveforms,
an output signal of a non-inverting form appearing in the output terminal according to the input signal given to the input terminal, characterized in that
the phase compensator is constituted by inserting series circuits of nonlinear resistive elements and switch elements between a control input terminal of the output element of the final amplifier and the output terminal of the load drive circuit,
the nonlinear resistive element has a nonlinear characteristic in which a resistance value decreases as an applied voltage value increases and the resistance value increases as the applied voltage value decreases, and
the switch elements are switching-controlled to selectively come into an ON state only in a high-electric potential period or a low-electric potential period of the input signal according to whether the output element is arranged on a high-electric potential side or a low-electric potential side in the final amplifier.

2. The load drive circuit according to claim 1, wherein the nonlinear resistive element is a transistor element that has a control input terminal and a pair of main terminals and is circuit-connected such that electric potential of this control input terminal follows electric potential of the output terminal of the load drive circuit.

3. The load drive circuit according to claim 1, wherein the final amplifier is constituted by a complimentarily-connected pair of output elements and the series circuits is inserted between a control input terminal of a high-electric potential side output element and the output terminal and between a control input terminal of a low-electric potential side output element and the output terminal, respectively.

4. The load drive circuit according to claim 1, wherein the final amplifier is constituted to connect a high-electric potential side output element and a load element or a low-electric potential side output element and a load element in series between a pair of power supply terminals and extract an output signal from a connection point thereof and the series circuits is inserted between a control input terminal of the high-electric potential side output element and the output terminal or between a control input terminal of the low-electric potential side output element and the output terminal.

5. The load drive circuit according to claim 4, wherein the load element is a constant current source constituted by one or two or more transistor elements.

6. The load drive circuit according to claim 1, wherein the preamplifier is an inverting amplifier that amplifies an electric potential difference between the input terminal and the output terminal and gives the electric potential difference to the output element of the final amplifier.

7. The load drive circuit according to claim 6, wherein the inverting amplifier is a differential amplifier of a current mirror type in which a constant current source is inserted in a common current path.

8. The load drive circuit according claim 1, wherein the preamplifier is a non-inverting buffer circuit that amplifies the input signal and a pull resistive element is inserted between a control input terminal and a power supply terminal of an output element.

9. The load drive circuit according to claim 8, wherein the non-inverting buffer circuit is a buffer circuit of a three-state type that can take a high-electric potential output state, a low-electric potential output state, and a high-impedance state.

10. The load drive circuit according to claim 8, wherein the pull resistive element is a poly resistor.

11. The load drive circuit according to claim 8, wherein the pull resistive element is a transistor element that has a control input terminal and a pair of main terminals and functions as a resistive element by mating the control input terminal conductive to one of the pair of main terminals.

12. The load drive circuit according to claim 8, wherein the pull resistive element is a constant current source constituted by one or two or more transistor elements.

13. The load drive circuit according to claim 1, wherein further comprising a control input terminal and a circuit for enabling/disabling an operation of the preamplifier and/or the phase compensator according to a control input signal given to the control input terminal.

* * * * *